United States Patent
Yen et al.

(10) Patent No.: US 7,125,741 B2
(45) Date of Patent: Oct. 24, 2006

(54) REWORK PROCESS OF PATTERNED PHOTO-RESIST LAYER

(75) Inventors: Yu-Lin Yen, Taipei (TW); Ching-Yu Chang, Yuanshan Township, Yilan County (TW)

(73) Assignee: Macronix International Co., Ltd., Hsinchu (TW)

( * ) Notice: Subject to any disclaimer, the term of this patent is extended or adjusted under 35 U.S.C. 154(b) by 194 days.

(21) Appl. No.: 10/720,735

(22) Filed: Nov. 24, 2003

(65) Prior Publication Data
US 2005/0009345 A1  Jan. 13, 2005

(30) Foreign Application Priority Data
Jul. 7, 2003  (TW) ............................... 92118533 A

(51) Int. Cl.
H01L 21/00 (2006.01)
H01L 21/4763 (2006.01)
H01L 21/44 (2006.01)

(52) U.S. Cl. .................. 438/72; 438/636; 438/952; 438/725

(58) Field of Classification Search .............. 438/72, 438/636, 725, 952
See application file for complete search history.

(56) References Cited

U.S. PATENT DOCUMENTS

| 5,883,006 A * | 3/1999 | Iba .............................. 438/712 |
| 6,200,907 B1 * | 3/2001 | Wang et al. ................. 438/718 |
| 6,251,568 B1 * | 6/2001 | Hsia et al. ................... 430/325 |
| 6,300,672 B1 * | 10/2001 | Lee ............................. 257/641 |
| 6,737,359 B1 * | 5/2004 | Yang et al. .................. 438/745 |
| 6,740,392 B1 * | 5/2004 | Farrar ......................... 428/209 |
| 6,861,177 B1 * | 3/2005 | Pinarbasi et al. .............. 430/5 |
| 6,884,734 B1 * | 4/2005 | Buehrer et al. ............. 438/723 |
| 6,903,023 B1 * | 6/2005 | Wise et al. ................. 438/705 |
| 2002/0058383 A1 * | 5/2002 | Mancini et al. ............. 438/286 |
| 2003/0017688 A1 * | 1/2003 | Hsu et al. ................... 438/593 |
| 2004/0102040 A1 * | 5/2004 | Adetutu et al. ............. 438/680 |

FOREIGN PATENT DOCUMENTS

TW   526539   4/2003

* cited by examiner

Primary Examiner—Carl Whitehead, Jr.
Assistant Examiner—James M. Mitchell
(74) Attorney, Agent, or Firm—Thomas, Kayden, Horstemeyer & Risley

(57) ABSTRACT

A rework process of patterned photo-resist layer is provided. First, a substrate is provided with a first DARC, a first primer and a first patterned photo-resist layer being sequentially formed thereon. Next, remove the first patterned photo-resist layer and the first primer from the first DARC. After that, form a second DARC on the first DARC; form a second primer on the second DARC. Last, form a second patterned photo-resist layer on the second primer.

16 Claims, 4 Drawing Sheets

REWORK PROCESS OF PATTERNED PHOTO-RESIST LAYER

This application claims the benefit of Taiwan patent application Serial No. 92118533, filed Jul. 7, 2003.

BACKGROUND OF THE INVENTION

1. Field of the Invention

The invention relates in general to a semi-conductor rework process of patterned photo-resist layer, and more particularly to a semi-conductor rework process of the patterned photo-resist layer on a dielectric anti-reflective coating (DARC).

2. Description of the Related Art

Microfilming and etching are two common processes in semi-conductor manufacturing process. After going through sub-processes including dehydration bake, priming, photo-resist spinning, soft bake, exposure, post-exposure bake, development and hard bake, micro-filming process forms a patterned photo-resist layer on the dielectric anti-reflective coating of a substrate to facilitate the subsequent etching process. Moreover, the accuracy and reliability of patterned photo-resist layer has much to do with the results of etching. Therefore, microfilming process really plays an important role in semi-conductor manufacturing process. When patterned photo-resist layer on DARC are found to have defects, e.g., over-etching or remnants on the surface of patterned photo-resist layer, instead of proceeding to etching process, a manufacturer would normally have the patterned photo-resist layer on DARC reworked. The description of the above process is disclosed below with accompanied drawings.

Referring from FIG. 1A to 1D, sectional flowcharts of a conventional semi-conductor rework process of patterned photo-resist layer. In FIG. 1A, first of all, a substrate 12 is provided with dielectric anti-reflective coating (DARC) 14 being formed thereon. Of which, DARC 14, which is made of hydrophilic materials such as SiON or $SiO_2$, can be a SiON layer or can comprise an SiON layer and a SiO2 layer formed thereon. Next, a hexamethyldisilazane (HMDS) layer 16 is formed on DARC 14 through evaporation while the first patterned photo-resist layer 18 is formed on HMDS layer 16 as shown in FIG. 1B. Of which, HMDS layer 16, which is interchangeable with hydrophilic functional groups, an OH or an OOH functional group for instance, facilitates first patterned photo-resist layer 18 to be adhered to DARC 14 firmly. Hence HMDS layer 16 is also called a primer.

If photo-resist manufacturing process needs to be reworked due to a failed micro-filming process or other factors, normally wet strip method or dry strip method is used to remove first patterned photo-resist layer 18 and HMDS layer 16. However, both strip methods always end up with many pin holes on the surface of DARC 14 as shown in FIG. 1C. The wet strip method, first of all, uses an acid agent consisted of HF and $H_2SO_4$ to remove first patterned photo-resist layer 18 and HMDS layer 16, wherein the acid agent erodes DARC 14 and leaves many pin holes containing ruminants of acid agent on the surface of DARC 14. Next, the wet strip method washes the surface of DARC 14 using an alkaline agent consisted of $NH_4OH$, $H_2O_2$ and de-ionized water to remove the particles adhered thereto. After the treatment of wet strip, the surface of DARC 14 will become hydrophilic because many hydrophilic functional groups such as OH, OOH and other functional groups are adhered onto the surface of DARC 14 after wash. The dry strip method, which uses oxygen plasma to remove first patterned photo-resist layer 18 and HMDS layer 16, also causes many pin holes on the surface of DARC 14, hence reducing the evenness thereof.

In the wake of the removal of first patterned photo-resist layer 18 and HMDS layer 16, the dry strip method forms another HMDS layer 26 on DARC 14 of FIG. 1C as shown in FIG. 1D through evaporation. Due to the adherence of hydrophilic functional groups other than OH functional group and OOH functional group onto the surface of DARC 14, HMDS layer 26 can only slightly reduce the hydrophilie on the surface of DARC 14. However, the surface of DARC 14 and HMDS 26 are still disposed to be hydrophilic, causing the adherence of the reworked patterned photo-resist layer to be reduced. Further due to the unevenness on the surface of DARC 14 or the remnants of acid agent contained in the pin holes thereon, the evenness on the surface of HMDS layer 26 formed on DARC 14 latter will be heavily influenced. When second patterned photo-resist layer 28 is formed on HMDS layer 26, the former can hardly be adhered onto the latter. Peeling will be easily experienced.

SUMMARY OF THE INVENTION

It is therefore an object of the invention to provide a reworked semi-conductor manufacturing process of patterned photo-resist layer. The design of forming the second DARC on the first DARC mitigates the unevenness and hydrophilie on the surface of the first DARC caused by strip method, hence preventing the patterned photo-resist layer reworked on the first DARC from peeling off.

It is therefore an object of the invention to provide a reworked semi-conductor manufacturing process of patterned photo-resist layer. First, a substrate is provided with the first DARC, the first primer and the first patterned photo-resist layer being sequentially formed thereon. Next, remove the first patterned photo-resist layer and the first primer from the first DARC. After that, form the second DARC on the first DARC; form the second primer on the second DARC. Last, form the second patterned photo-resist layer on the second primer.

It is therefore an object of the invention to provide a reworked semi-conductor manufacturing process of patterned photo-resist layer. First, a substrate is provided with the first SiON layer, the first $SiO_2$ layer, the first primer and the first patterned photo-resist layer being sequentially formed thereon. Next, remove the first patterned photo-resist layer and the first primer from the first $SiO_2$ layer. After that, form the second $SiO_2$ layer or the second SiON layer on the first $SiO_2$ layer; form the second primer on the second $SiO_2$ layer or the second SiON layer. Last, form the second patterned photo-resist layer on the second primer.

It is another object of the invention to provide a reworked semi-conductor manufacturing process of patterned photo-resist layer. First, a substrate is provided with the first SiON layer, the first primer and the first patterned photo-resist layer being sequentially formed thereon. Next, remove the first patterned photo-resist layer and the first primer from the SiON layer. After that, form the second SiON layer or a $SiO_2$ layer on the first SiON layer; form the second primer on the second SiON layer or the $SiO_2$ layer. Last, form the second patterned photo-resist layer on the second primer.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
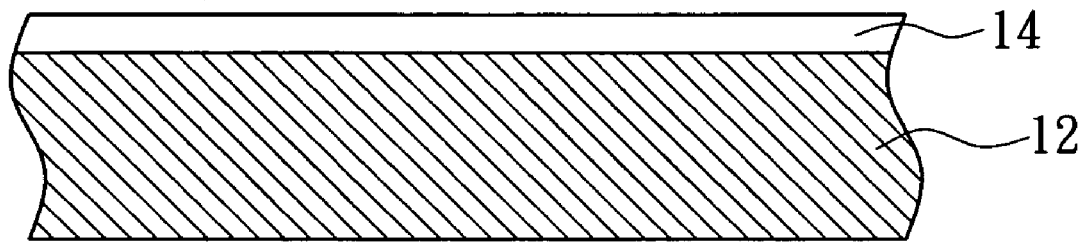
FIG. 1A to 1D, sectional flowcharts of a conventional semi-conductor reworked manufacturing process of patterned photo-resist layer.
Figure 1B:
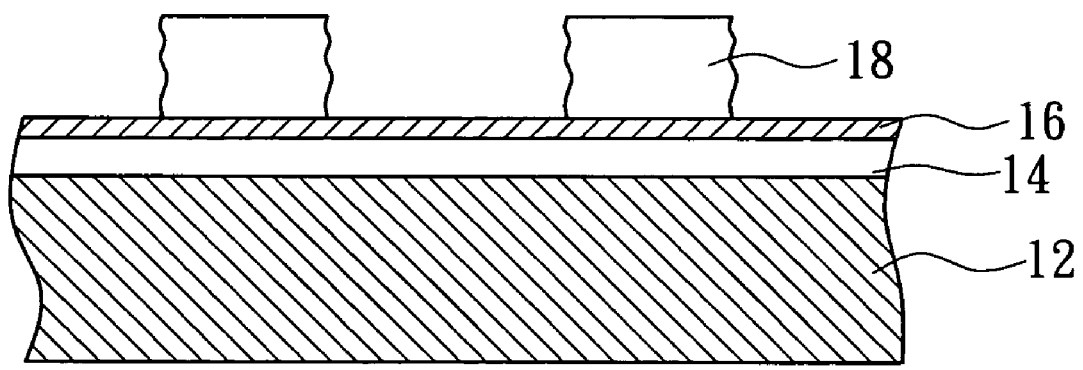
Figure 1C:
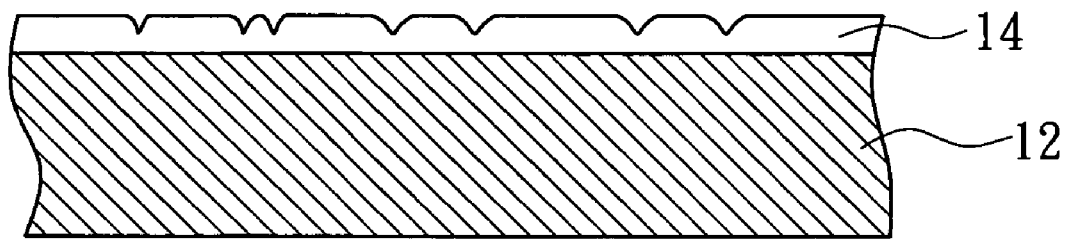
Figure 1D:
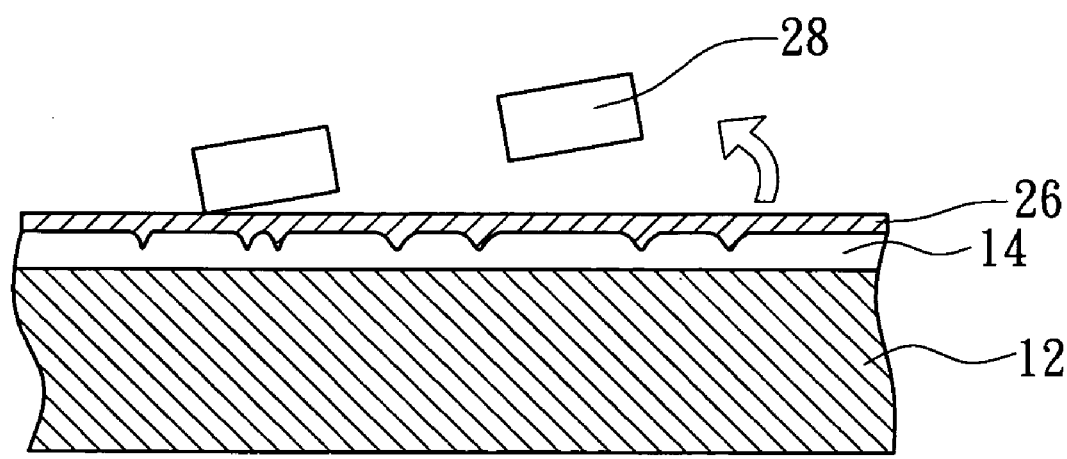
Figure 2A:
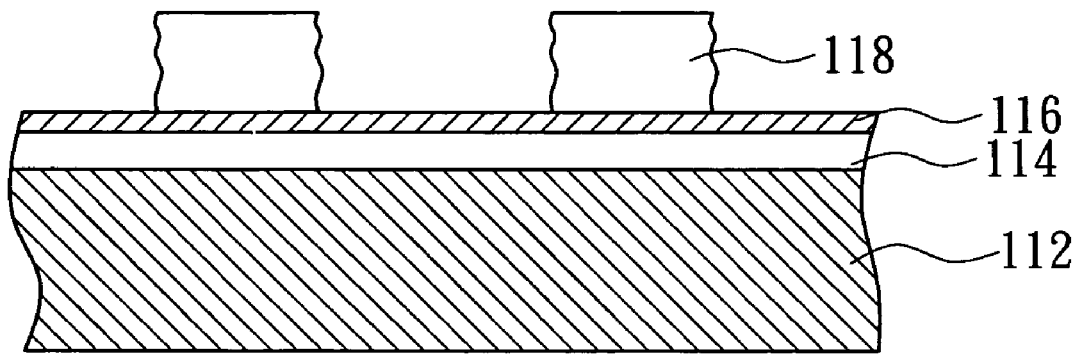
FIG. 2A to 2E, sectional flowcharts of the reworked semi-conductor manufacturing process of patterned photo-resist layer according to a preferred embodiment of the invention.

Referring first from FIG. 2A to FIG. 2E, sectional flowcharts of the rework process of a semi-conductor patterned photo-resist layer according to a preferred embodiment of the invention. In FIG. 2A, first of all, substrate 112 is provided with first dielectric anti-reflective coating (first DARC) 114, first primer 116 and first patterned photo-resist layer 118 being sequentially formed thereon, wherein first DARC 114 is made of hydrophilic materials. For example, first DARC 114 can be a SiON layer or can comprise the first SiON layer and the first $SiO_2$ layer formed on the first SiON layer. When photo-resist manufacturing process needs to be reworked due to a failed micro-filming process or other factors, the manufacturing process required includes removing first patterned photo-resist layer 118 and first primer 116 from first DARC 114. This can be done using either wet strip method or dry strip method.

Figure 2B:
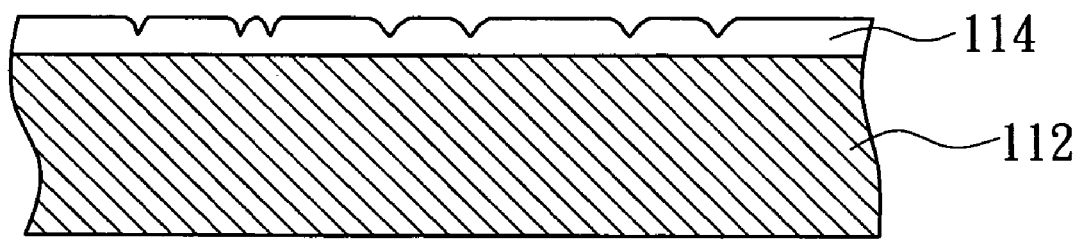

The wet strip method, first of all, uses an acid agent consisted of HF and $H_2SO_4$ to remove first patterned photo-resist layer 118 and first primer 116 from first DARC 114. Next, the wet strip method uses an alkaline agent consisted of $NH_4OH$, $H_2O_2$ and de-ionized water to wash the surface of DARC 114. The surface of DARC 114, which becomes hydrophilic in the wake of the removal of first patterned photo-resist layer 118 and first primer 116, will become rougher or will even form many pin holes with remnants of acid contained within as shown in FIG. 2B. The dry strip method uses oxygen plasma to remove first patterned photo-resist layer 118 and first primer 116 from first DARC 114. The surface of first DARC 114 will be uneven or even have many pin holes formed thereon as shown in FIG. 2B.

Figure 2C:
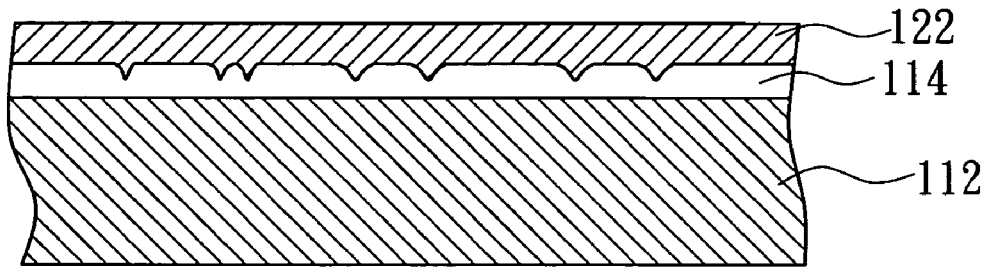
Figure 2D:
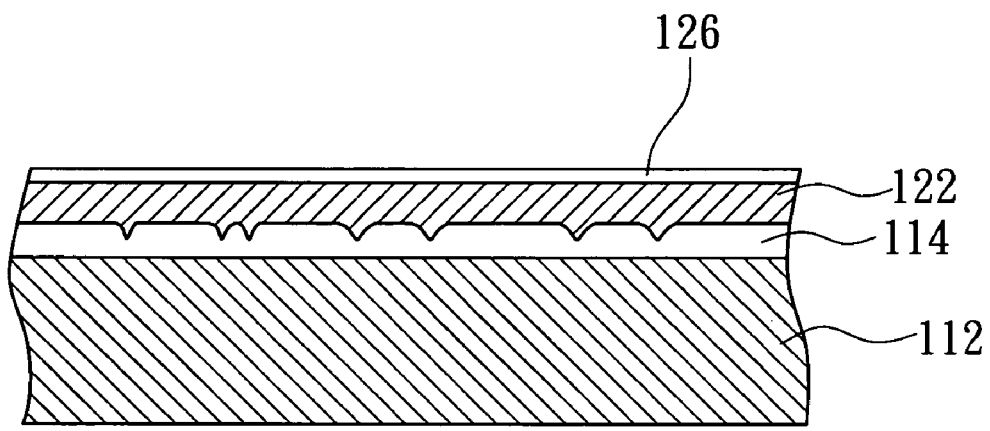

Next, form the second DARC 122 on first DARC 114 as shown in FIG. 2C wherein second DARC 122 fills up the pin holes on the surface of first DARC 114 and covers up first DARC 114 whose surface is hydrophilic.

Figure 2E:
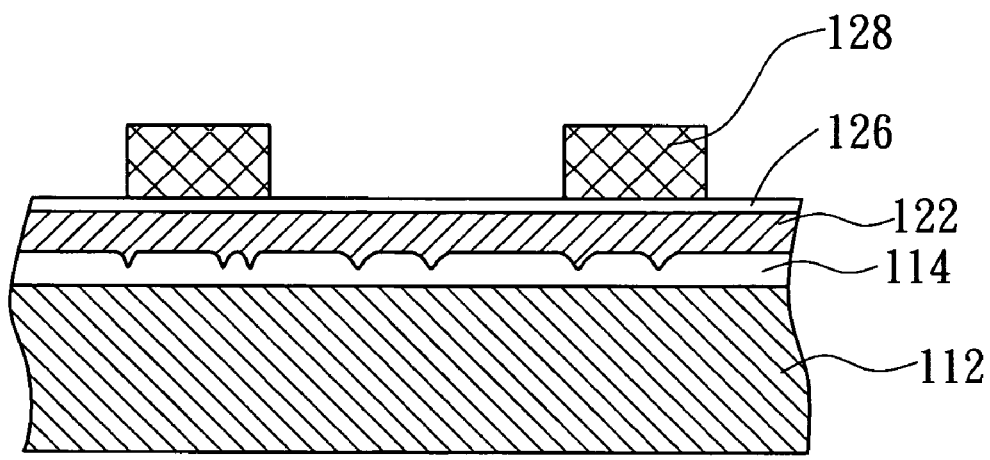

If first DARC 114 is a SiON layer, second DARC 122 can be a SiO2 layer or another SiON layer; if the first DARC 114 comprises the first SiON layer and the first $SiO_2$ layer formed on the first SiON layer, the second DARC 122 can be the second $SiO_2$ layer or the second SiON layer. In short, the material of the second DARC 122 must be the same with or compatible with that of the first DARC 114, i.e., hydrophilic materials. Next, form the second patterned photo-resist layer 128 on the second primer 126 as shown in FIG. 2E.

However, anyone who is familiar with the technology of the invention is not to be limited thereto. For example, the material of primer 116 and second primer 126 can both be hexamethyldisilazane (HMDS).

The rework process of patterned photo-resist layer disclosed in the above preferred embodiment forms the second DARC on the surface of the first DARC, which has been treated using strip method. Such design mitigates the unevenness and hydrophilie on the surface of the first DARC caused by strip method, hence preventing the second patterned photo-resist layer reworked on the first DARC from peeling off.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A rework process of patterned photo-resist layer, comprising at least:
    providing a substrate with a first dielectric anti-reflective coating (DARC), a first primer and a first patterned photo-resist layer being sequentially formed thereon;
    removing the first patterned photo-resist layer and the first primer from the first DARC;
    forming a second DARC on the first DARC;
    forming a second primer on the second DARC; and
    forming a second patterned photo-resist layer on the second primer,
    wherein the first DARC comprises:
    a SiON layer; and
    a $SiO_2$ layer formed on the SiON layer.

2. The rework process according to claim 1, wherein the step of removing the first patterned photo-resist layer and the first primer from the first DARC further comprises the step of:
    using a wet strip method to remove the first patterned photo-resist layer and the first primer from the first DARC.

3. The rework process according to claim 2, wherein the step of using a wet strip method to remove the first patterned photo-resist layer and the first primer from the first DARC further comprises the steps of:
    using an acid agent to remove the first patterned photo-resist layer and the first primer from the first DARC; and
    using an alkaline agent to wash the surface of the first DARC.

4. The rework process according to claim 3, wherein the acid agent comprises HF and $H_2SO_4$.

5. The rework process according to claim 3, wherein the alkaline agent comprises $NH_4OH$, $H_2O_2$ and de-ionized water.

6. The rework process according to claim 1, wherein the step of removing the first patterned photo-resist layer and the first primer from the first DARC further comprises the step of:
    using a dry strip method to remove the first patterned photo-resist layer and the first primer from the first DARC.

7. The rework process according to claim 6, wherein the step of using a dry strip method to remove the first patterned photo-resist layer and the first primer from the first DARC further comprises the steps of:
    using oxygen plasma to remove the first patterned photo-resist layer and the first primer from the first DARC.

8. The rework process according to claim 1, wherein the second DARC is another SiON layer.

9. The rework process according to claim 1, wherein the second DARC is another $SiO_2$ layer.

10. The rework process according to claim 1, wherein the first primer and the second primer are both made of hexamethyldisilazane (HMDS).

11. A reworked semi-conductor rework process of patterned photo-resist layer, comprising at least:
provinding a substrate with a first SiON layer, a first $SiO_2$ layer, a first primer and a first patterned photo-resist layer being sequentially formed thereon;
removing the first patterned photo-resist layer and the first primer from the first $SiO_2$ layer,
forming a second $SiO_2$ layer or a second SiON layer on the first $SiO_2$ layer;
forming a second primer on the second $SiO_2$ layer or the second SiON layer; and
forming a second patterned photo-resist layer on the second primer.

12. The rework process according to claim 11, wherein the step of removing the first patterned photo-resist layer and the first primer from the first $SiO_2$ layer further comprises the steps of:
using an acid agent to remove the first patterned photo-resist layer and the first primer from the first $SiO_2$ layer; and
using an alkaline agent to wash the surface of the first $SiO_2$ layer.

13. The rework process according to claim 11, wherein the acid agent comprises HF and $H_2SO_4$.

14. The rework process according to claim 12, wherein the alkaline agent comprises $NH_4OH$, $H_2O_2$ and de-ionized water.

15. The rework process according to claim 11, wherein the step of removing the first patterned photo-resist layer and the first primer from the first $SiO_2$ layer further comprises the steps of:
using oxygen plasma to remove the first patterned photo-resist layer and the first primer from the first $SiO_2$ layer.

16. The rework process according to claim 11, wherein the first primer and the second primer are both made of hexaniethyldisilazane (HMDS).

* * * * *